United States Patent
Li (10) Patent No.: US 6,853,254 B2
(45) Date of Patent: Feb. 8, 2005

(54) ANTI-DEADLOCK CIRCUIT AND METHOD FOR PHASE-LOCKED LOOPS

(75) Inventor: Shenggao Li, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 135 days.

(21) Appl. No.: 10/330,559

(22) Filed: Dec. 30, 2002

(65) Prior Publication Data

US 2004/0124936 A1 Jul. 1, 2004

(51) Int. Cl.[7] .................................................. H03L 7/00
(52) U.S. Cl. ........................................ 331/16; 331/25
(58) Field of Search ............................. 331/16, 25, 15, 331/11, 14, 17, 1 A; 327/157, 160

(56) References Cited

U.S. PATENT DOCUMENTS

| | | | | |
|---|---|---|---|---|
| 4,488,199 A | * | 12/1984 | Bloomer | 361/94 |
| 5,208,555 A | | 5/1993 | Graham et al. | 331/1 A |
| 5,436,597 A | * | 7/1995 | Dunlap et al. | 331/1 A |
| 5,694,087 A | | 12/1997 | Ferraiolo et al. | 331/11 |
| 5,831,483 A | * | 11/1998 | Fukuda | 331/17 |
| 6,100,767 A | * | 8/2000 | Sumi | 331/11 |
| 6,177,843 B1 | | 1/2001 | Chou et al. | 331/25 |
| 6,369,660 B1 | | 4/2002 | Wei et al. | 331/15 |
| 2001/0013801 A1 | * | 8/2001 | Johnson | 327/157 |

* cited by examiner

Primary Examiner—Robert Pascal
Assistant Examiner—Joseph Chang
(74) Attorney, Agent, or Firm—Fleshner & Kim, LLP (57) ABSTRACT

A system and method for controlling a phase-locked loop detects a deadlock condition and then adjusts an output frequency of an oscillator until the deadlock condition is corrected. The deadlock condition may be detected based on a value of a charge pump signal which controls the oscillator frequency. In accordance with one embodiment, deadlock is detected if the value of the charge pump signal approaches one of two supply rail voltages. The deadlock condition is overcome by manipulating current signals output from the charge pump. This is accomplished by turning off the current from one charge-pump current source and increasing current from a second-charge pump current source. The increased current may be provided by a third current source located within or external to the charge pump. By adding current from the third current source, the output frequency of the phase-locked loop will be driven lower until a value is reached which effectively pulls the PLL out of the deadlock condition.

36 Claims, 7 Drawing Sheets

ANTI-DEADLOCK CIRCUIT AND METHOD FOR PHASE-LOCKED LOOPS

BACKGROUND OF THE INVENTION

1. Field of the Invention

This invention relates to generating frequency signals, and more particularly to a system and method for controlling the generation of frequencies in oscillator circuits such as but not limited to phase-locked loops.

2. Description of the Related Art

Phase-locked loop (PLL) circuits are found in many processing systems. They are, for example, commonly used to generate mixing signals in communications systems and clock signals for controlling the speed and synchronizing the operation of various components in microprocessor systems.

While PLL circuits have proven to be desirable in terms of their ability to generate a stable frequency output, they are not without drawbacks. For example, many conventional PLL circuits experience a condition known as deadlock which can render the PLL and its host system inoperable for all practical purposes. Deadlock arises as a result of a difference between the frequency range of the voltage-controlled oscillator (VCO) portion of the PLL and the operational limitations of one or more accompanying elements. For example, it is often the case that a VCO is used which can operate at frequencies that exceed the maximum operational frequency of the phase-frequency detector of the PLL. At these frequencies, the phase-frequency detector will become overdriven and as a result its output will become clamped to a power supply potential or ground. The same situation may arise in a frequency divider located along a feedback path of the PLL. When either of these situations arises, the PLL is said to be deadlocked and thus unusable for any practical application.

Various approaches have been taken in attempt to correct deadlock in a PLL. Most of these approaches involve the use of a counter circuit or a custom-made frequency divider designed to operate at higher-than-normal operating frequencies. Both approaches have proven undesirable. For example, the use of counter circuits increases power requirements and chip space that may otherwise be used for more functionally important purposes. The use of custom-made frequency dividers is also inefficient because it increases the cost of the overall system.

In view of the foregoing considerations, it is apparent that there is a need for an improved system and method for correcting deadlock in a phase-locked loop, and more specifically one which takes a corrective approach which does not realize any of the drawbacks of the conventional methods.

DESCRIPTION OF THE PREFERRED EMBODIMENTS

The present invention is implemented in various forms for controlling the generation of frequencies in a processing system. One embodiment of the present invention relates to a controller which controls the output frequency of a frequency generator such as but not limited to a phase-locked loop. Another embodiment of the present invention related to a charge pump which may include or be implemented with a controller of the aforementioned type. Another embodiment of the present invention relates to a frequency generator which includes a controller or charge pump of the aforementioned type. Another embodiment of the present invention related to a method for controlling the output frequency of a frequency generator such as a phase-locked loop. The present invention is also a processing system which includes a frequency generator as mentioned above. While the various embodiments of the invention may advantageously be applied to preventing or correcting a deadlock condition in an oscillator circuit, it is emphasized that the invention is not limited to this purpose. Rather, as those skilled in the art can appreciate the various embodiments. of the invention may be used to control a frequency generator to produce output frequencies within any desired frequency range.

Figure 1:
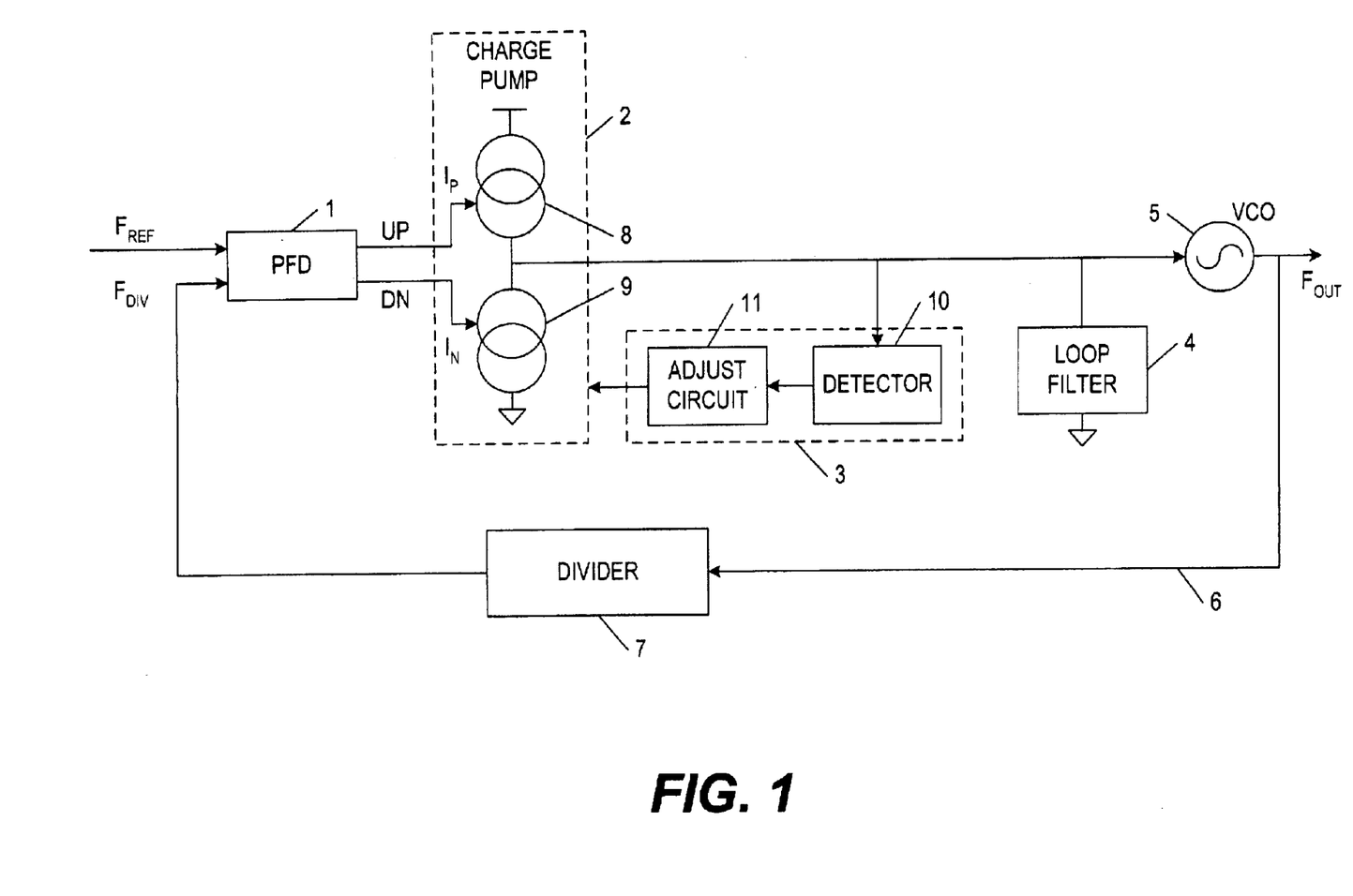
FIG. 1 is a diagram showing an oscillator circuit in accordance with one embodiment of the present invention.

FIG. 1 is a diagram showing a frequency generator in accordance with one embodiment of the present invention. In this embodiment, the frequency generator is in the form of a phase-locked loop circuit which includes a phase-frequency detector 1, a charge pump 2, a controller 3, a loop filter 4, and a voltage-controlled oscillator 5 which outputs a frequency signal $F_{out}$.

The phase-frequency detector compares a reference frequency $F_{ref}$ to a signal from a feedback path 6. The feedback signal may correspond to $F_{out}$ in circumstances where a frequency divider circuit is not included in the feedback path, or $F_{div}$ in circumstances were a frequency divider is included. As those skilled in the art can appreciate, the divider is optional. For illustrative purposes, a frequency divider 7 is included along the feedback path. The phase-frequency detector generates two control signals for controlling the charge pump based on a difference between its two input frequency signals. These control signals include an Up control and a Down control signal.

The charge pump includes two current sources, a first current source 8 which generates a positive current signal ($I_p$) and a second current source 9 which generates a negative current source ($I_n$). The first current source may therefore be said to supply source current/voltage and the second current source a sinking current/voltage. The Up control signal from the phase-frequency detector controls the supply of current from the positive current source, and the Down control signal controls the supply of current from the negative current source.

Current signals from the negative and positive current sources of the charge pump form a control signal which, after being filtered by the loop filter, is used to control or set the frequency output from the voltage-controlled oscillator. When applied to prevent or correct a deadlock condition, the control signal sets the output frequency of the VCO to a lower value which lies within operating limits of the phase-frequency detector and/or frequency divider. A more detailed explanation of the manner in which this output frequency is controlled is provided below.

The controller performs the function of adjusting the control signal from the charge pump so that the output frequency of the voltage-controlled oscillator will be set to a desired frequency or frequency range. Preferably, the controller adjusts the control signal from the charge pump in a manner which prevents a deadlock condition from occurring or which corrects such a condition once it has occurred.

As previously mentioned, a deadlock condition arises from a mis-match between the upper frequency limit of the voltage-controlled oscillator and the operational limitations of one or more elements in the phase-locked loop. Typically, a deadlock condition (also known as "VCO runaway" or a "lock-up" condition) occurs in one of two situations. First, when the upper frequency limit of the voltage-controlled oscillator is substantially higher than the speed limit of a frequency divider in the feedback path of the phase-locked loop. Second, as a result of the upper frequency limit of the voltage-controlled oscillator being substantially higher than the speed limit of the phase-frequency detector. This second situation may arise, for example, when a frequency divider is not included in the feedback path of the phase-locked loop.

When either situation arises, the phase-locked loop may enter a locked state which effectively renders it inoperable for purposes of generating frequency signals at the desired frequency. For example, when the charge pump outputs a control signal which drives the voltage-controlled oscillator at or near its upper frequency limit, a frequency divider in the feedback path will be overdriven if this upper frequency limit is substantially higher than the maximum operational frequency of the divider. In this overdriven state, the output of the divider will be clamped to a power supply potential or ground, and this in turn will place the phase-locked loop into a deadlocked condition. A similar situation may arise when no divider exists in the feedback path and the phase-frequency detector is overdriven. As those skilled in the art can appreciate, deadlock may also occur if the voltage-controlled oscillator is not operating at its upper frequency limit, so long as the frequency (or speed) of the VCO output is substantially higher than the operational limits of, for example, the feedback divider and/or phase-frequency detector.

The controller performs two functions in order to prevent or correct a deadlock condition. In accordance with the embodiment of FIG. 1, these functions are performed by detection unit 10 and adjustment unit 11. The detection unit determines whether a deadlock condition has occurred or is imminent by analyzing the VCO control signal output from the charge pump. When such a condition is detected, the adjustment unit modifies the signal output from the charge pump in an manner which will reduce the output frequency of the voltage-controlled oscillator. In accordance with the present invention, the controller performs this modification without using timer or counter circuits which tend to increase the power-consumption requirements of the PLL and consume precious chip space. Further, the controller modifies the control signal of the VCO so that the speed of recovery of the PLL is not compromised once it has been corrected from a deadlock condition.

Further, for cases where a frequency divider is located in the feedback path of the PLL, the controller prevents or removes a PLL from deadlock without requiring the use of an expensive, custom-made divider having enhanced operational frequency limits. Instead, the controller adjusts the output frequency of the PLL to lie within the operational limits of a standard divider.

Figure 2:
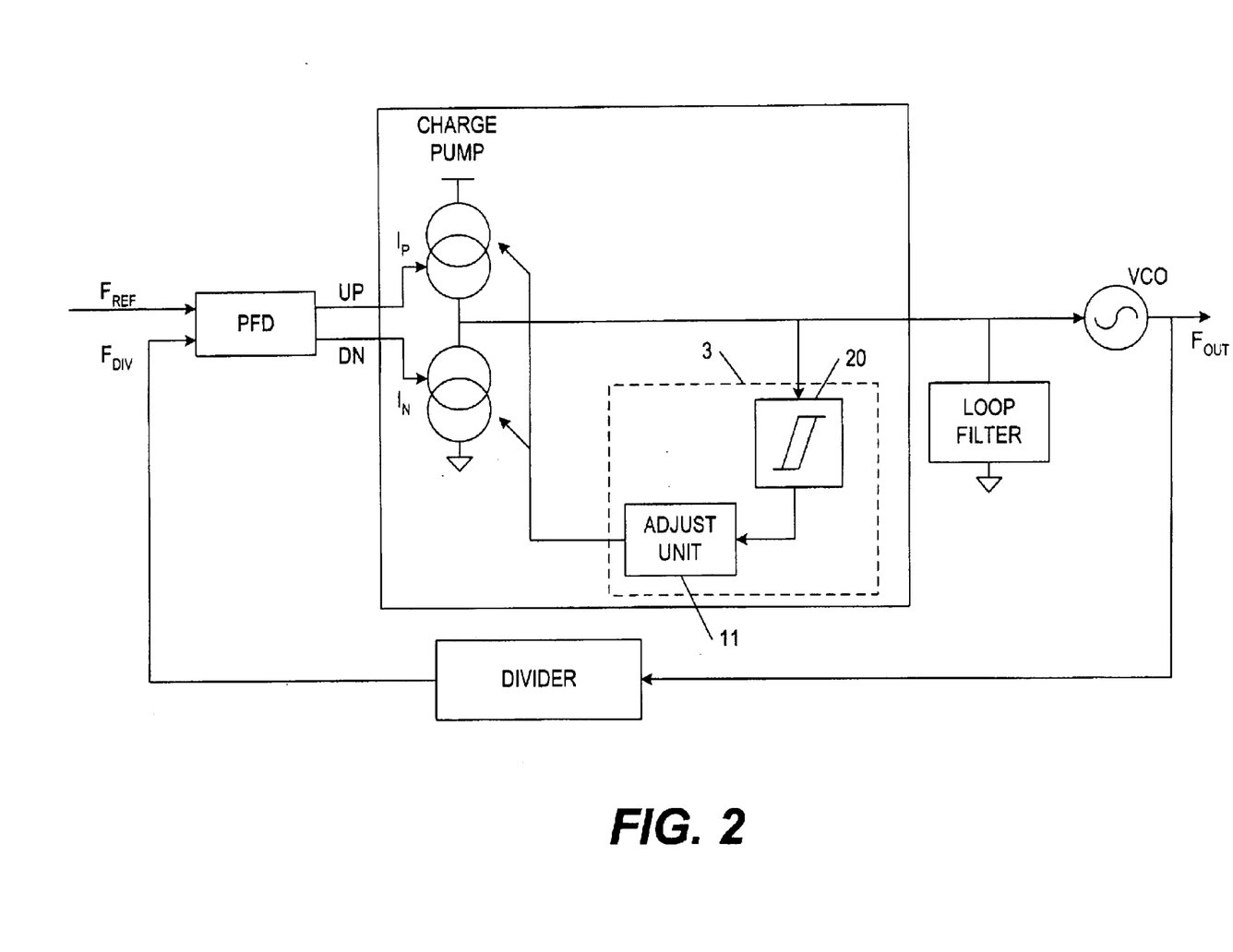
FIG. 2 is a diagram showing a controller which may be used to adjust a VCO control signal output from a charge pump included in the oscillator circuit of FIG. 1.

FIG. 2 shows one embodiment of the controller in FIG. 1. In this embodiment, the detection unit includes a comparator in the form of a Schmidt trigger. As will be explained in greater detail, the Schmidt trigger detects whether a deadlock condition has occurred or is imminent based on a comparison of the control voltage output from the charge pump and one or more threshold voltages. Once this comparison has been performed, a signal is output to the adjustment unit which sets the VCO control signal by switching current signals $I_p$ and $I_n$ supplied from the positive and negative current sources. This may be accomplished by reducing or eliminating the current signal from one of the two current sources in the charge pump and enhancing the current signal from the other of the two current sources. The current sources which are reduced/eliminated and enhanced may be determined based on whether the voltage-controlled oscillator has negative or positive gain.

Figure 3:
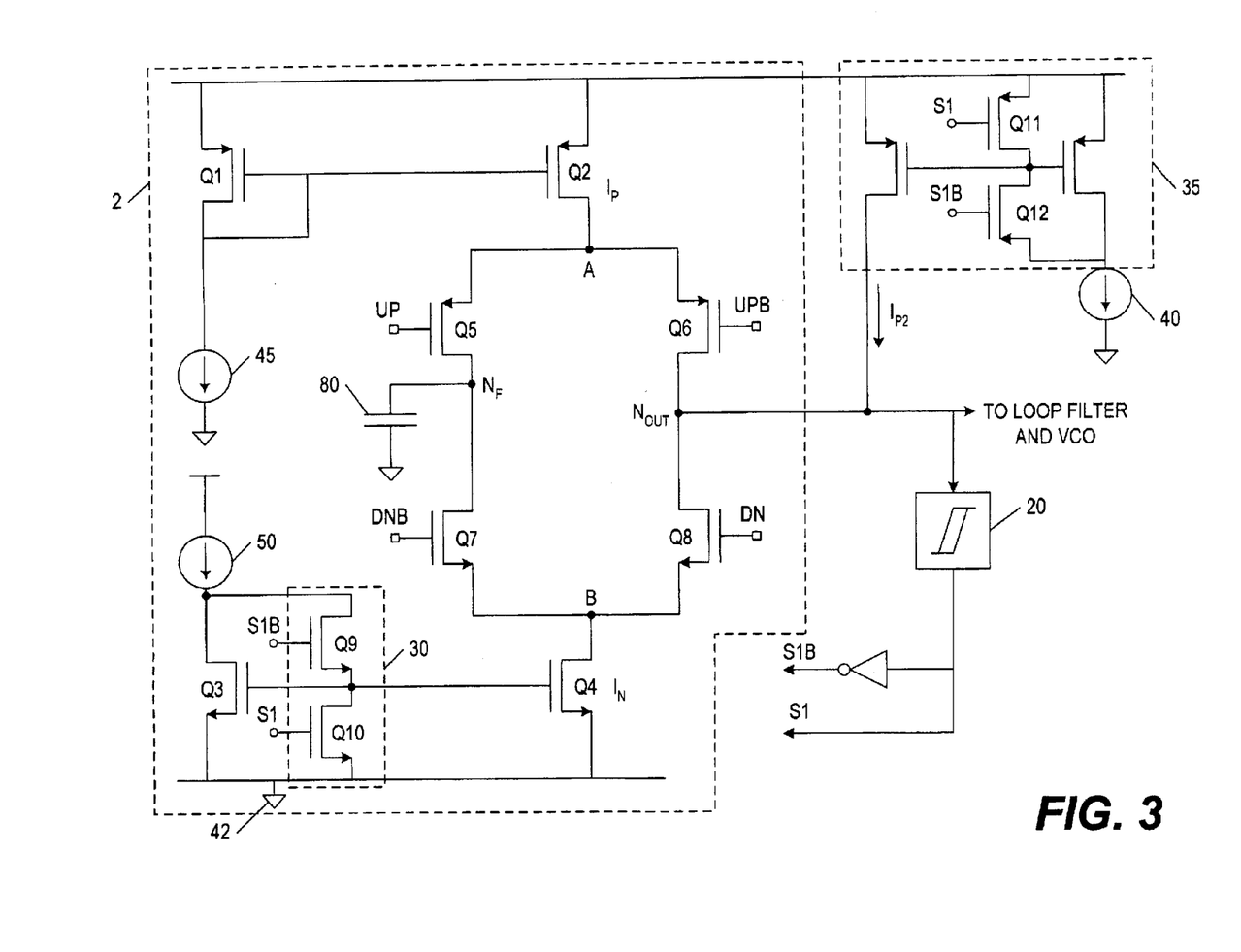
FIG. 3 is a diagram showing an adjustment circuit included in the controller shown in FIG. 2.

FIG. 3 shows an example of an adjustment unit which may be used in accordance with the present invention. The adjustment unit includes a first control switch 30, and a second control switch 35 connected to an auxiliary current source 40. The first and second control switches are responsive to the output of the Schmidt trigger and are used to control current supplied from the two current sources of the charge pump and the auxiliary current source respectively. The first control switch may be connected to a potential 42 which may be ground. The control switches may be integrated into a charge pump configured as follows.

The charge pump includes a first current mirror formed from two MOS transistors Q1 and Q2 which control the supply of current $I_p$ from current source 45. A second current mirror includes two MOS transistors Q3 and Q4 which control the supply of current $I_n$ from current source 50 through the first control switch of the adjustment unit of an embodiment of the present invention. In this case, it may be said that transistors Q1 and Q2 provide source current which changes the output frequency of the voltage-controlled oscillator in one direction, and that transistors Q3 and Q4 perform the function of sinking current and changing the frequency output from the voltage-controlled oscillator in the opposite direction. Whether or not currents $I_p$ and $I_n$ increase or decrease the output frequency depends on the gain of the VCO.

The charge pump further includes a set of four MOS transistors Q5, Q6, Q7, and Q8 which are connected to control the flow of current from/to the current sources/sinks based on the Up and Down signals from the phase-frequency detector. In this configuration, the gates of transistors Q5 and Q6 are connected to the Up signal and its complement UPB respectively and transistors Q7 and Q8 are connected to the DN signal and its complement DNB respectively. When connected in this manner, the charge pump may be said to have a differential design. The manner in which transistors Q5–Q8 are switched to control the flow of current in to/out from the loop filter will now be described.

When UP is asserted and DN is not asserted, UP=1 and DN=0. This causes transistors Q6 and Q7 to switch on and transistors Q5 and Q8 to switch off. As a result, current $I_p$ is steered through Q6 and input into the loop filter through output node $N_{out}$, thereby causing the loop-filter voltage to increase. Current $I_n$ is steered through Q7 to cause the voltage in capacitor 80 to decrease.

When UP is asserted and DN is asserted, UP=1 and DN=1. This causes transistors Q6 and Q8 to turn on and transistors Q5 and Q7 to turn off. As a result, current $I_p$ is steered through Q6, while current $I_n$ is steered through Q8. In normal operation, $I_p$ and $I_n$ may be equal so the net current into the loop filter is zero. That is, current from the postive current source is sinked into the negative current source. As a result, the current output from node $N_{out}$ is zero and the loop-filter voltage does not change. (Although it may be desirable for $I_p$ and $I_n$ to be equal, under practical conditions $I_p$ and $I_n$ may not be. As a result, a net sinking or sourcing current may exist at the output node $N_{out}$.)

When UP is not asserted and DN is asserted, UP=0 and DN=1. This causes transistors Q5 and Q8 to turn on and transistors Q6 and Q7 to turn off. As a result, current $I_p$ is steered through Q5 and flows into capacitor 80. This causes the voltage of capacitor 80 to increase. Current $I_n$ is steered through Q8 which causes the loop-filter voltage to decrease.

When UP is not asserted and DN is not asserted, UP=0 and DN=0. This causes transistors Q5 and Q7 to turn on and transistors Q6 and Q8 to turn off. As a result, current $I_p$ is steered through Q5, while current $I_n$ is steered through Q7. That is, current from the postive current source is sinked to the negative current source, and since $I_p$ and $I_n$ are equal (under ideal conditions) the net current flowing into capacitor 80 is zero. Therefore, no current flow into or out from the loop filter. In this case, the loop-filter voltage does not change. In each of the cases above, the values of 0 and 1 for the UP and DN signals are provided merely for illustration purposes. Those skilled in the art can appreciate that the values may be reversed depending, for example, upon the type of transistors used to implement the charge pump.

The function of capacitor 80 in the foregoing circuit will now be discussed. In accordance with the present invention, the output of the charge pump maybe single-ended, i.e., one output of the charge pump may be connected to the loop filter while the other output may be floating. Without a capacitor on the floating output node $N_f$, theoretically when transistor Q7 is turned on and transistor Q5 is turned off, the sinking current $I_n$ will immediately pull the floating output node to the same potential as node B. Similarly, when transistor Q7 is turned off and and transistor Q5 is turned on, the source current $I_p$ will pull the floating node to the same potential as node A. Such frequent toggling between the node-A potential and the node-B potential will cause significant charge injection into the loop filter. Charge injection is considered undesirable by system designers because it causes the loop filter voltage to be inaccurate. A source follower may be used to alleviate the charge-injection problem.

Figure 4:
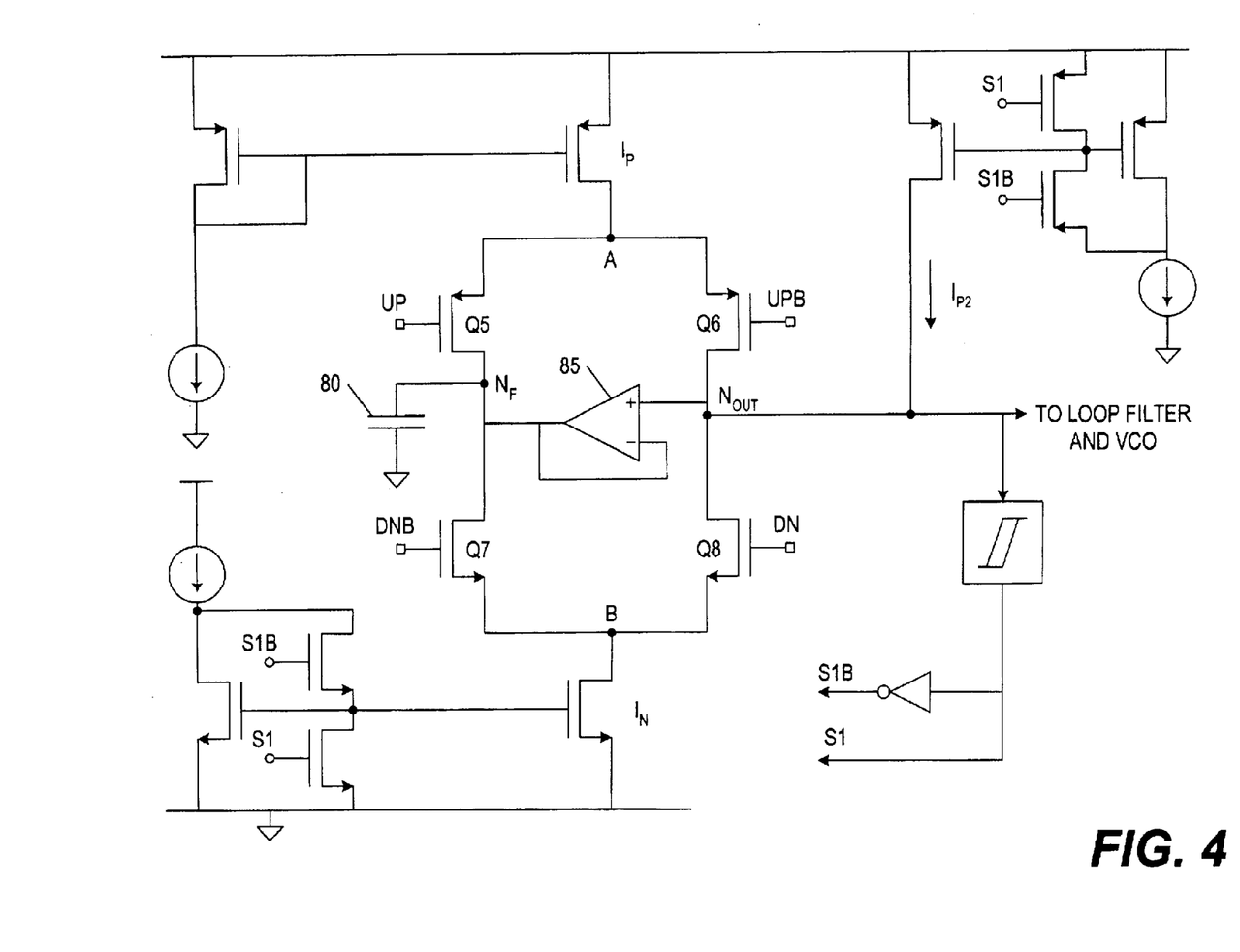
FIG. 4 is a diagram showing an example of the adjustment circuit of FIG. 3 containing an element for reducing charge injection therein.

FIG. 4 shows an example of a charge pump circuit which includes a source follower in accordance with the present invention. As shown, the source follower 85 may be attached between nodes Nf and Nout. When connected in this manner, node Nf will always track node Nout, thereby when transistors Q5 and Q6 (or Q7 and Q8) are switched, the voltage variation at node A (or nod B) is kept at a minimum. The source follower is desirable because if Nf voltage is significantly different from Nout voltage, charge injection will uccur whenver transistors Q5–Q8 are switched. For example, when UP is switched from 0 to 1, node A will initially exchange charge with node Nf through transistor Q5 when UP=0. Onice UP=1, node A will exchange charge with node Nout. Thus, if Nf and Nour are significantly different, there will be considerable charge transferred between node Nf and node Nout through node A. Similar charge injection may occur at node B when DN is switched from 0 to 1.

While a source follower has been described as being one type of circuit for reducing charge injection, those skilled in the art can appreciate that other circuits maybe used for this purpose. Also, while the charge pump of FIGS. 3 and 4 has a configuration which may accommodate a source follower as a charge-injection reduction circuit, other charge pump configurations may be used. In these other configurations a detection and adjustment circuit may be situated at an output node and an analogous adjustment may be performed in order to correct deadlock.

With the foregoing undertanding in mind, the function of capacitor 80 becomes clear. In FIGS. 3 and 4, capacitor 80 is used to stablize corresponding output node $N_f$. The capacitance of this capacitor may be chosen to be near or equal to the capacitor in the loop filter in order to make the two outputs relatively balanced, however other capacitances may be used if desired.

In FIGS. 3 and 4, current signals $I_p$ and $I_n$ are switched based on the output of the detection circuit of the invention. In this embodiment, the detection circuit is a Schmidt trigger which outputs control signal S1 and its complement S1B. When the Schmidt trigger of the present invention detects that a deadlocked state does not exist or is not imminent, the Schmidt trigger remains in reset mode and signal S1 is not asserted. During this time, none of the control switches of the adjustment unit are activated and thus the operation of the charge pump is not modified from its normal operating conditions, i.e., during this time the VCO control signal from the charge pump is controlled by the Up and Down signals output from the phase-frequency detector.

When the Schmidt trigger detects that a deadlocked state has occurred or is imminent, signal S1 from the Schmidt trigger will be asserted and the adjustment unit will adjust the VCO control signal from the charge pump in a manner which will ensure that the deadlock condition is prevented or removed. The manner of adjustment depends on whether the VCO has negative or positive gain. If the VCO has negative gain, the adjustment unit of the present invention will increase the voltage of the VCO control signal to effect a proportional reduction in the output frequency of the VCO. Conversely, if the VCO has positive gain, the adjustment unit will reduce the voltage of the control signal in order to effect a proportional reduction in the output frequency of the VCO.

In the exemplary embodiment of FIGS. 3 and 4, the adjustment circuit is configured for a negative-gain VCO. When implemented in this manner, control signals S1 and S1B output from the Schmidt trigger will cause control switch 30 to turn off the supply of negative current $I_n$ from current source 50. This may be accomplished, for example, using the tandem of MOS transistors Q9 and Q10, where transistor Q9 has its source and transistor Q10 has its drain connected to the signal line connecting the gates of transistors Q3 and Q4. With this arrangement, when control signal S1 goes high corresponding to the detection of a deadlock condition, the switch formed by transistor Q10 is closed and the switch of transistor Q9 is opened. As a result, the gates of Q3 and Q4 are shorted to ground and are turned off, and the negative current source 50 will not be mirrored to $I_n$ as in normal operation mode, thereby effectively blocking current $I_n$ from passing to the loop filter and VCO.

Control switch 35 performs an opposite function with respect to auxiliary current source 40. Specifically, when S1 goes high the switches formed by MOS transistors Q11 and Q12 are switched to allow auxiliary current $I_{p2}$ from source 40 to be combined with the current $I_p$, from positive current source 45. As a result, the charge pump outputs a VCO control signal with increased voltage, and because the VCO has negative gain this increased-voltage control signal causes the output frequency of the VCO to be lowered. This voltage will continue to increase and the corresponding output frequency of the VCO will continue to be lowered until the PLL circuit is pulled out of its deadlocked state. Once the VCO frequency is low enough and the PLL moves out of deadlock, the Schmidt trigger will detect this condition and automatically return to reset mode. Signal S1 will then go low, thereby causing control switches 30 and 35 to be deactivated. Operation of the charge pump will then resume based on normal conditions.

Figure 5:
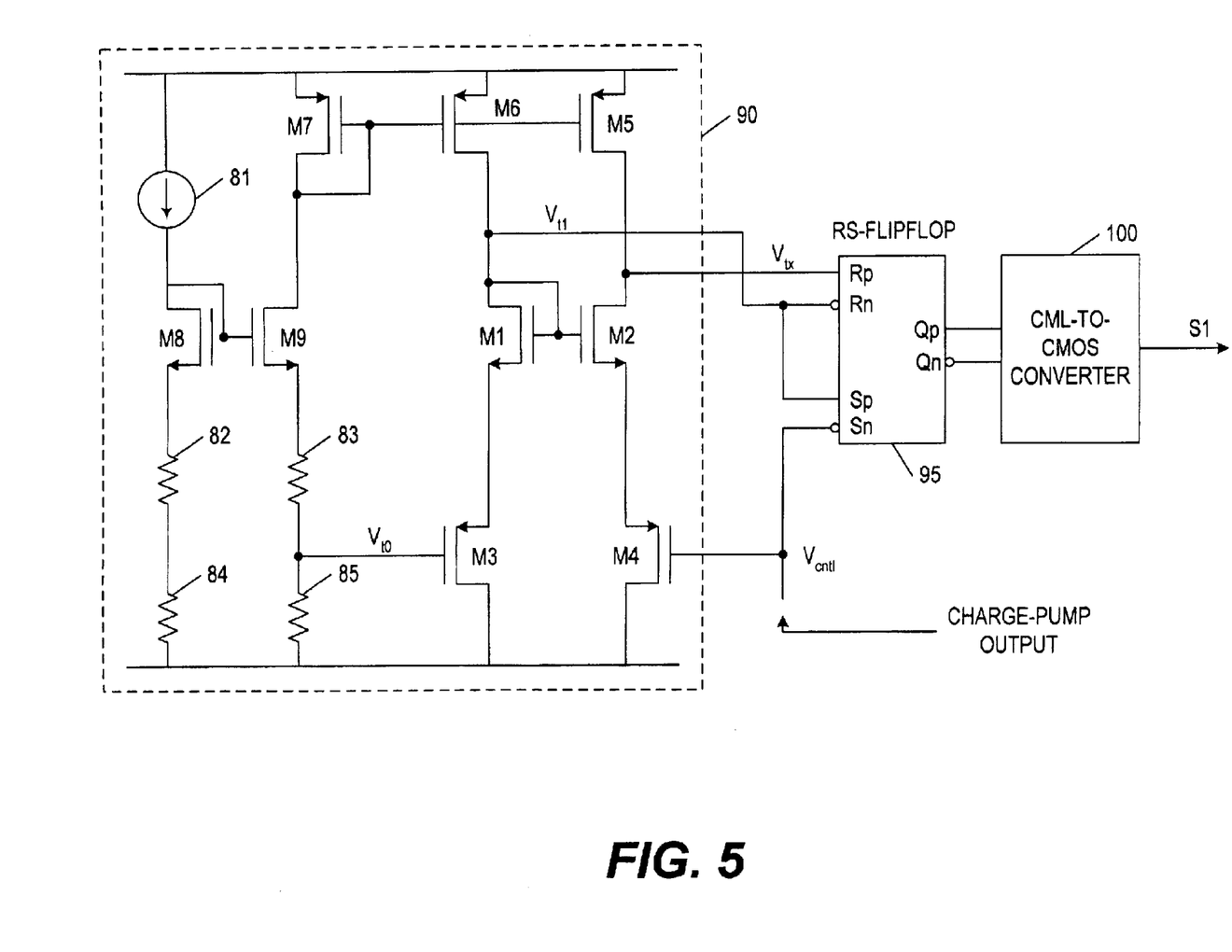
FIG. 5 is a diagram showing a detector which may be included the controller shown in FIG. 2.

FIG. 5 shows a CMOS implementation of the Schmidt trigger in accordance with the present invention. This implementation includes a comparator circuit 90, a flip-flop circuit 95, and a CML-to-CMOS converter 100, the output of which corresponds to signal S1 which may be used to control the switching of the adjustment unit shown in FIG. 3. The flip-flop is illustratively shown as an RS-type flip-flop implemented in CML logic which generates hysteresis. Those skilled in the art can appreciate, however, that other types of flip-flops may be used if desired.

The comparator circuit includes transistors M1–M9, bias current source 81, and resistors 82, 83, 84, and 85. Transistors M1–M4 form a balanced circuit which operates in accordance with two threshold voltages $V_{t0}$ and $V_{t1}$. The first threshold voltage, $V_{t0}$, is determined by current source 81 and resistor 85. The value of this voltage may be chosen to be near the negative power supply rail (or ground). In this arrangement, current source 81 is mirrored by transistors M8 and M9 and is further mirrored to transistors M5 and M6 through transistor M7. Current source 81 also sets up the bias current for the balanced circuit formed by transistors M1–M4. The second threshold voltage, $V_{t1}$, is therefore determined by the current source 81 and the geometry and process characteristics of transistors M1, M3, and M6. $V_{t1}$ may have an almost aribitrary value as long as it is significantly larger than $V_{t0}$ (e.g., about 500 mV larger than $V_{t0}$).

Resistors 82–85 may be considered to be source degeneration resistors. Transistors M8 and M9 do not need to be equal as long as the aspect ratio (W/L) of M9/M8 is equal to the resistance ratio of (R83+R85)/(R82+R84). As previously indicated, resistor 85 is used to obtain threshold voltage $V_{t0}$. Resistor 84 is a matched part of resistor 85 and resistors 82 and 83 may be matched as well. These latter resistors may be considered redundant but are desirable because they lend flexibility to modifying $V_{t0}$ if $V_{t0}$ is too large or small for a given application of the presenet invention.

In operation, the charge pump outputs a control voltage $V_{cntl}$ which is analyzed by the Schmidt trigger of the present invention to determine whether a deadlock condition exists or is imminent. Threshold voltages $V_{t0}$ and $V_{t1}$ are compared with the control voltage from the charge pump to determine, first, whether a deadlock condition exists and, second, when the adjustment unit of the present invention should be automatically deactivated after correction of the deadlock condition has taken place.

For a negative-gain VCO, low voltage at the VCO input translates into a high-frequency output from the VCO. Thus, if the VCO input is near a negative supply rail (which is commonly ground), conditions exist for causing the phase-locked loop to enter a deadlock condition. A first threshold voltage $V_{t0}$ of the Schmidt trigger may therefore be selected, within desirable tolerances, to detect this condition and output a signal S1 to the adjustment unit for varying the VCO control signal in a manner which will remove the PLL from deadlock. For the negative-gain case, the VCO control signal must be therefore increased. A second threshold voltage $V_{t1}$ of the Schmidt trigger may be selected, within desirable tolerances, to control the amount of increase of the VCO control signal.

Operation of the Schmidt trigger will now be described for the negative-gain VCO case. For illustration purposes only, threshold voltage $V_{t0}$ will be set slightly above 0 V and threshold voltage $V_{t1}$ will be set to a value that will reduce the VCO frequency to a point low enough to accommodate the speed limitation of the element or elements (e.g., frequency divider, phase-frequency detector, etc.) in the phase-locked loop causing the deadlock condition. For example, if a frequency divider is included in the feedback path of the PLL, threshold voltage $V_{t1}$ may be set to a value that will cause the output frequency of the VCO to exist within a frequency range of the divider.

When the voltage $V_{cntl}$ from the charge pump falls below $V_{t0}$, the Schmidt trigger detects that the output frequency of the voltage-controlled oscillator (and thus the PLL) has increased to the point where a deadlock state has occurred or in imminent. Since $V_{cntl} < V_{t0} < V_{t1}$, Sp-Sn of the RS flip-flop is at a state "1." Meanwhile, the balanced circuit formed from MOS transistors M1–M4 will force voltage signal $V_{tx} < V_{t1}$. Consequently, Rp-Pn of the RS flip-flop is placed in a state of "0." As a result, the RS flip-flop is in set operation and Qp-Qn will be driven to a state of "1." This means that S1="1" and S1B="0." This will cause control switch unit 30 to turn off the negative current $I_n$ in the charge pump and at the same time turn on the switch control unit 35 of the auxiliary current source. Because the positive current source is on at this time, the signal flowing through the loop filter will correspond to a combined current of $I_p$ and $I_{p2}$. As a result of the addition of the auxiliary current $I_{p2}$, the VCO control voltage $V_{cntl}$ will begin to increase and thereby slow down the frequency output from the VCO.

Once control voltage $V_{cntl}$ exceeds $V_{t0}$ (e.g., $V_{t0} < V_{cntl} < V_{t1}$), the balance circuit formed by MOS transistors M1–M4 will force $V_{tx} > V_{t1}$. This will cause the flip-flop to assume the values Rp-Rn="1" and Sp-Sn="1." The output of the RS flip-flop is thus held unchanged and the charge-pump will continue to deliver increased current (i.e., current increased by $I_{p2}$) to the loop filter. This, in turn, will continue to cause $V_{cntl}$ to increase, further lowering the output frequency of the VCO.

As $V_{cntl}$ continues to rise, the output frequency of the VCO is reduced to even a lower value. Eventually, $V_{cntl}$ will assume a value which is greater than $V_{t1}$. At this point, it is reasonable to conclude that the PLL has been pulled out of a deadlock condition. At this time, Rp-Rn="1" and Sp-Sn="0" which will have the effect of resetting the flip-flop.

Once the flip-flop (or Schmidt trigger) has been reset and the PLL has been pulled out of deadlock condition, the S1 output of the Schmidt trigger (and its corresponding complement S1B) will assume a value (e.g., "0") that will cause control switch circuit 35 to turn off the current $I_{p2}$ from the auxiliary power source and cause control switch 30 to turn on current $I_n$ from the negative current source. With the positive and negative currents $I_p$ and $I_n$ on, the charge-pump will return to a normal mode of operation.

The manner in which the transistors in the balanced circuit are switched to achieve the above performance will now be described. When $V_{cntl} < V_{t0}$, the gate voltage of transistor M4 is smaller than the gate voltage of transistor M3. Therefore, the source voltage of M2 is smaller than the source voltage of M1. Given that M5 and M6 conduct the same current and M1 and M2 have the same gate voltage, $V_{tx}$ will be smaller than $V_{t1}$. For the flip flop, this means Rp<Rn. If $V_{t0}$ is pre-designed to be smaller than $V_{t1}$, $V_{cntl}$<$V_{t1}$ and thus Sp>Sn.

When $V_{cntl}$>$V_{t1}$, transistors M2 and M4 are forced to be turned off because the gate of M2 is connected to $V_{t1}$, which is smaller than $V_{cntl}$. In this case, $V_{tx}$ is equal to the positive power supply since there is no current following through M5. As a result, Rp>Rn and Sp<Sn for the flip flop inputs.

When $V_{t0}$<$V_{cntl}$<$V_{t1}$, then $V_{tx}$>$V_{t1}$. Therefore, Rp<Rn and Sp>Sn.

In the cases described above, transistors M1 and M3 preferably stay unchanged and M1 and M3 are designed to operate in the typical saturation region of MOS transistors, i.e., they may not be in switched mode. Transistors M2 and M4 may or may not be in switched mode depending on the $V_{cntl}$ voltage.

The controller of the present invention represents a significant improvement in the art. For example, the controller allows the VCO control signal to be automatically controlled in a manner which will prevent or correct a deadlock state of the PLL. The PLL will then be automatically placed back into a normal operating condition. This advantage of automatic control is achieved through the use of the comparator circuit of the present invention, which continuously monitors the output of the charge pump. By continuously monitoring this value, the occurrence and termination of a deadlock condition may automatically be detected without the use of counters, timer circuits, or other components that consume substantial amounts of power and chip space. Also, as long as $V_{cntl}$ stays above $V_{t0}$, the controller will remain in reset (or hold) mode, thereby ensuring that the phase-locked loop will operate in non-deadlocked state.

Because the controller of the present invention does not use counters or timer circuits, no impact is produced on the speed of the charge pump or its ability to recover after a deadlock condition has occurred. This is because the controller and more specifically the control switches of the adjustment unit and the comparator of the present invention are not situated along the critical signal path inside the charge pump. This will therefore translate into improved efficiency and performance.

The adjustment unit and Schmidt trigger shown in FIGS. 3–5 are implemented for a negative-gain VCO. Those skilled in the art can appreciate that these circuits may just as easily be formed for a positive-gain VCO. In this case, for example, the control switch 30 may be connected to control the supply of current from the positive current source 45 and the second control switch may be arranged to introduce negative auxiliary current.

Figure 6:
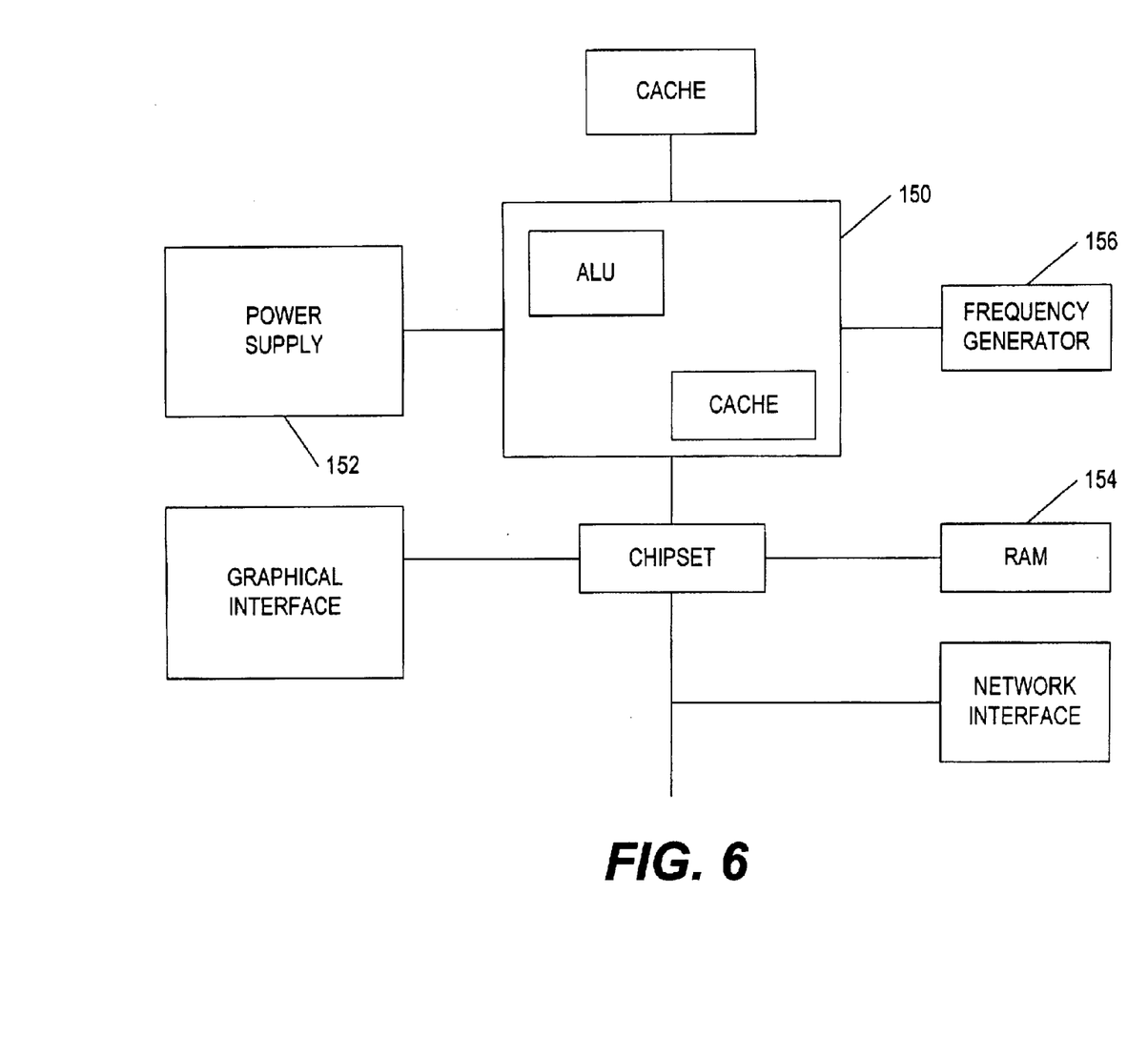
FIG. 6 is a diagram showing one embodiment of a processing system which includes the oscillator of the present invention.

FIG. 6 shows a processing system in accordance with one embodiment of the present invention. The processing system includes a processing chip 150, a power supply 152, a memory 154, and a frequency generator 156 which includes phase-locked loop of the present invention as previously described. The processing chip may include a microprocessor, an ASIC, or some other processing system. Also, while the frequency generator is shown as residing off-chip, those skilled in the art can appreciate that the frequency generator may also be formed on-chip in order to reduce space and thus promote miniaturization.

Figure 7:
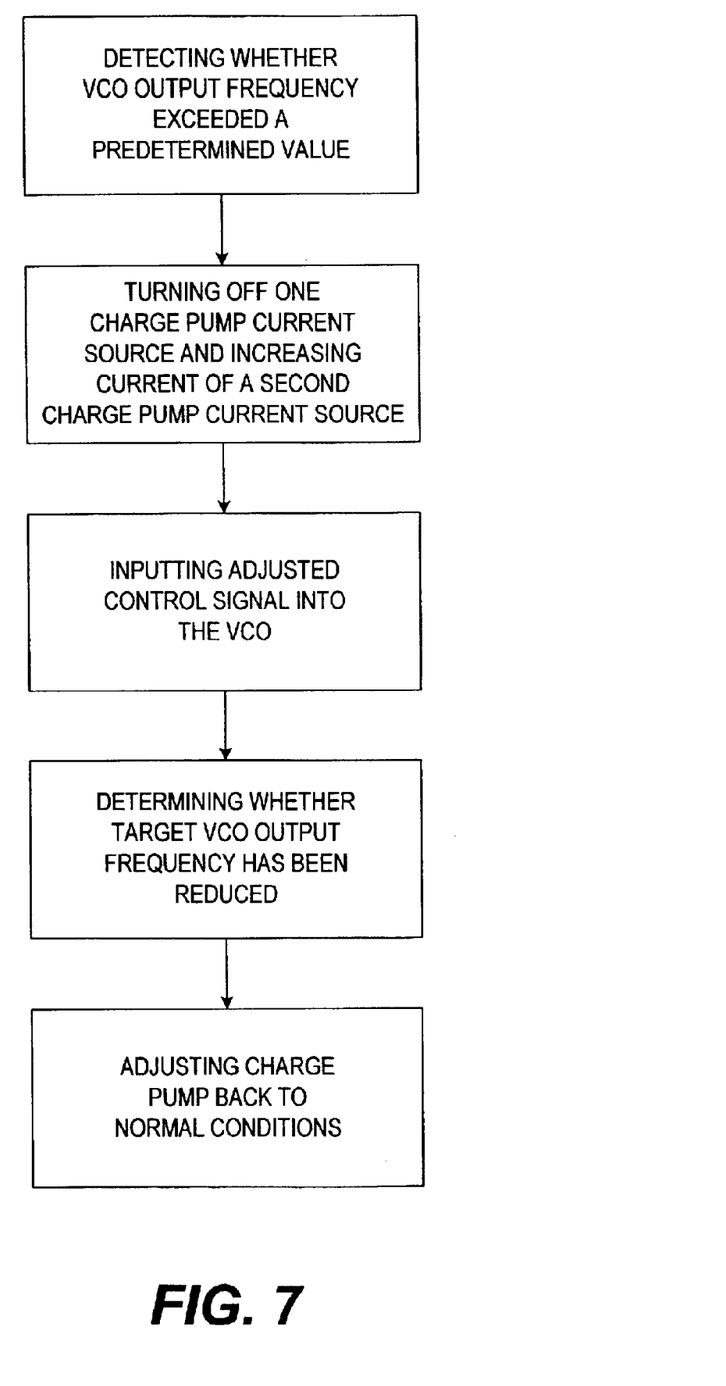
FIG. 7 is a flow diagram, showing steps included in one embodiment of a method for controlling an oscillator circuit in accordance with the present invention.

FIG. 7 shows steps included in a method for controlling the output frequency of an oscillator circuit in accordance with one embodiment of the present invention. The oscillator circuit may be a phase-locked loop circuit as previously described or any one of a number of other types of oscillator circuits. Also, while the method is suitable for use in preventing or correcting a deadlock condition in a PLL, the method may be used to perform oscillator frequency control in other contexts. For example, the method may be applied to control the output of an oscillator to lie within or avoid frequency ranges that are not necessarily based on the maximum operational frequencies of the elements which comprise the oscillator circuit. Thus, if the oscillator circuit is intended to generate frequencies within only a certain range as determined by a desired application, then the method of the present invention may be implemented to output frequencies only within this range.

An initial step of the method includes detecting that the output frequency of the phase-locked loop has exceeded a predetermined frequency value. In order to prevent a deadlock condition from occurring, this value may be set based on the frequency limitations of one or more elements of the PLL circuit. For example, if a divider is included in the feedback path the predetermined frequency value may be set at or near a maximum operational frequency of the divider. If no feedback divider is included, the predetermined frequency value may be set at or near a maximum operational frequency of the phase-frequency detector of the PLL. (As previously emphasized, the method of the present invention may be applied to perform frequency control in contexts other than preventing deadlock. In these instances, the predetermined frequency value may be set to ensure that the output frequencies of the oscillator circuit lies within or avoids a specified frequency range.)

Detecting whether the output frequency of the phase-locked loop has exceeded a predetermined value may be performed by comparing a control voltage of the voltage-controlled oscillator to a predetermined value. (Block 200). Because the control voltage of the VCO is proportional to its output frequency, the magnitude of the control voltage may serve as a basis for detecting a deadlock condition. The initial step of the method may therefore be performed by comparing the VCO control voltage output from the charge pump to a reference voltage corresponding to one of two supply rails. The reference voltage may be chosen based on the gain of the VCO. If the VCO has negative gain, the reference voltage may be chosen at or near a lower-voltage supply rail, which may be ground. If the VCO has positive gain, the reference voltage may be chosen at or near an upper-voltage supply rail, e.g., Vdd. As previously discussed, the determination of whether a VCO control voltage has exceeded the reference voltage may be performed using a comparator such as but not limited to a Schmidt trigger.

A second step of the method includes adjusting the control signal of the oscillator to prevent or correct the deadlock condition. This step is preferably performed by reducing current from or completely turning off one current source in the charge pump and supplementing the current supplied by a second charge pump with current from a third current source. (Block 210). The type of current supplied by the third source depends on the gain of the oscillator circuit. If the oscillator circuit has negative gain, the negative current (or sinking) current source is turned off and the positive current source is supplemented with current from auxiliary positive current source.

A third step includes inputting the adjusted control signal into the oscillator circuit. (Block 220). The addition of the auxiliary current increases the control voltage of the oscillator, and this, in turn, reduces the frequency of the oscillator output.

A fourth step includes monitoring the output frequency of the oscillator. This may be performed by monitoring the voltage of the oscillator control signal output from the charge pump. Over time, the auxiliary current causes the control voltage to steadily change (increase in the case of a negative-gain oscillator or decrease in the case of a positive-gain oscillator). The comparator detects that the voltage of the control signal has surpassed a threshold voltage set to a value which corresponds to a frequency range which does not correspond to a deadlock condition. (Block 230).

A fifth step includes adjusting the charge pump back to normal operating conditions. (Block 240). This involves turning off the auxiliary current source and turning back on or increasing the current from the first current source. At this point, the oscillator circuit will continue to output frequency signals within a range which does not produce a deadlock condition.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention.

For example, while the detection unit of the present invention has been described as corresponding to a Schmidt trigger, those skilled in the art can appreciate that other types of detection/comparison circuits may alternatively be used. For example, any detection or comparator circuit which provides hysteresis will suffice, provided that circuit triggers the anti-deadlock operation of the present invention at a first reference point (e.g., $V_{r0}$) and then returns to a normal operating condition at a second reference point (e.g., $V_{r1}$), that is, after entering into a normal operating frequency range. Moreover, while the reference voltages of the Schmidt trigger of the present invention have been described as being fixed, they may alternatively be made programmable. Also, other ways of making the reference level tunable from off-chip may be performed.

Also, while the Schmidt trigger and adjustment unit are shown as being included within the charge pump, these elements may be included at any location along the signal path connecting the charge pump and voltage-controlled oscillator.

I claim:

1. A phase-locked loop, comprising:
    an oscillator;
    a charge pump which generates a first current signal and a second current signal;
    a controller which reduces the first current signal and increases the second current signal based on a frequency output from the oscillator, the controller including:
    a first control switch to control current from a first current source; and
    a second control switch to control current from a third current source, wherein the second current signal is increased by adding current from the third current source to current from a second current source.

2. The phase-locked loop of claim 1, further comprising:
    a detector which detects when the output frequency of the oscillator lies within a first predetermined frequency range, wherein the controller reduces the first current signal using the first control switch and increases the second current signal using the second control switch when the detector detects that the output frequency of the oscillator lies within the first predetermined frequency range.

3. The phase-locked loop of claim 2, wherein the controller increases the second current signal by an amount which causes the output frequency of the oscillator to approach a second predetermined frequency range.

4. The phase-locked loop of claim 3, wherein the first predetermined frequency range includes frequencies which produce a deadlock condition and the second predetermined frequency range includes frequencies which do not produce a deadlock condition.

5. The phase-locked loop of claim 2, wherein the detector includes a Schmidt trigger.

6. The phase-locked loop of claim 2, wherein at least one of the detector and controller is located in the charge pump.

7. The phase-locked loop of claim 1, wherein the controller reduces the first current signal to zero using the first control switch.

8. The phase-locked loop of claim 1, wherein the first control switch turns off the current from the first current source.

9. The phase-locked loop of claim 1, wherein the controller forms a control signal for controlling the output frequency of the oscillator based on the increased second current signal.

10. A charge pump, comprising:
    a first current source;
    a second current source; and
    a controller for reducing current from the first current source and increasing a current signal from the second current source, wherein the controller includes:
    a first control switch to control current from the first current source; and
    a second control switch to control current from a third current source, wherein the current signal from the second current source is increased by adding current from the third current source to current from the second current source.

11. The charge pump of claim 10, wherein the first control switch turns off current from the first current source.

12. The charge pump of claim 10, further comprising:
    a detector for detecting an output frequency of an oscillator, wherein the controller reduces current from the first current source and increases the current signal from the second current source based on an output of the detector.

13. The charge pump of claim 12, wherein the controller reduces current from the first current source and increases the current signal from the second current source when the detector detects that the output frequency of the oscillator corresponds to a deadlock condition.

14. The charge pump of claim 12, wherein the detector detects the output frequency of the oscillator based on a magnitude of a signal output from the charge pump.

15. A method for controlling an oscillator, comprising:
    reducing a first current signal of a charge pump;
    increasing a second current signal of the charge pump; and
    forming an oscillator control signal based on the increased second current signal, wherein the second current signal is increased by adding auxiliary current to the second current signal, wherein the first current signal is supplied by a first current source, the second current signal is supplied by a second current source, and the auxiliary current is supplied by a third current source.

16. The method of claim 15, wherein the first current source is a negative current source and the second and third current sources are positive current sources.

17. The method of claim 15, wherein the second current signal is increased by an amount which causes an output frequency of the oscillator to approach a predetermined frequency range.

18. The method of claim 15, wherein the second current signal is increased by an amount which causes an output frequency of the oscillator to fall below a predetermined frequency value.

19. The method of claim 18, wherein the predetermined frequency value corresponds to a deadlock condition.

20. The method of claim 15, further comprising:

detecting that an oscillator frequency has exceeded a predetermined frequency before the first current signal of the charge pump is reduced.

21. The method of claim 20, wherein the predetermined frequency is a value which corresponds to a deadlock condition.

22. The method of claim 20, wherein the predetermined frequency is a value which corresponds to an upper operational frequency of an element of the oscillator.

23. The method of claim 22, wherein said element is one of a frequency divider and a phase-frequency detector.

24. The method of claim 15, wherein the first current source is a positive current source and the second and third current sources are negative current sources.

25. The method of claim 15, wherein the first current signal is reduced to zero.

26. A method for controlling a charge pump, comprising:

comparing an output signal of the charge pump to a predetermined value; and reducing a first current signal of the charge pump and increasing a second current signal of the charge pump based on a result of the comparison, wherein the second current signal is increased by adding auxiliary current to the second current signal, wherein the first current signal is supplied by a first current source, the second current signal is supplied by a second current source, and the auxiliary current is supplied by a third current source.

27. The method of claim 26, further comprising:

forming an oscillator control signal based on at least one of the reduced first current signal and the increased second current signal.

28. The method of claim 27, wherein the predetermined value is indicative of a deadlock condition.

29. A system, comprising:

a chip; and a frequency generator which includes:

(a) an oscillator;

(b) a charge pump which generates a first current signal and a second current signal; and (c) a controller which reduces the first current signal and increases the second current signal based on a frequency output by the oscillator, wherein the frequency generator is located either on said chip or off said chip and the controller includes a first control switch which controls the first current signal and a second control switch which controls current from a third current source, the second current signal being increased by adding current from the third current source to the second current signal.

30. The system of claim 29, wherein the frequency generator further includes:

a detector which detects when the output frequency of the oscillator lies within a first predetermined frequency range, wherein the first control switch reduces the first current signal and the second current signal is increased with current from the third current source when the detector detects that the output frequency of the oscillator lies within the first predetermined frequency range.

31. A charge pump, comprising:

a first current source;

a second current source; and a controller to adjust current from the first current source and a current signal from the second current source, the controller including:

a first control switch to control current from the first current source; and a second control switch to control current from a third current source, wherein the current signal from the second current source is adjusted by combining current from the third current source with current from the second current source.

32. The charge pump of claim 31, wherein the first current source is a positive current source and the second and third current sources are negative current sources.

33. The charge pump of claim 31, wherein the first current source is a negative current source and the second and third current sources are positive current sources.

34. The charge pump of claim 31, wherein the first control switch turns off current from the first current source.

35. The charge pump of claim 31, further comprising:

a detector to detect a signal indicative of an output frequency of an oscillator;

a comparator to compare an output of the detector to a reference value, wherein the first and second control switches control current from the first and third current sources respectively based on an output of the comparator.

36. The phase-locked loop of claim 1, wherein the controller reduces the first current signal and increases the second current signal based on an output signal of the charge pump, said charge pump signal providing an indication of the frequency output from the oscillator.

* * * * *